United States Patent [19]

Chang et al.

[11] Patent Number: 4,517,047

[45] Date of Patent: May 14, 1985

[54] MBE GROWTH TECHNIQUE FOR MATCHING SUPERLATTICES GROWN ON GAAS SUBSTRATES

[75] Inventors: Chin-An Chang, Peekskill; Leroy L. Chang, Goldens Bridge; Leo Esaki, Chappaqua, all of N.Y.

[73] Assignee: The United States of America as represented by the Secretary of the Army, Washington, D.C.

[21] Appl. No.: 227,889

[22] Filed: Jan. 23, 1981

[51] Int. Cl.$^3$ ............................................. C30B 25/02
[52] U.S. Cl. ................................... 156/610; 148/175; 427/87; 156/DIG. 103
[58] Field of Search ............ 156/DIG. 103, 610, 612; 148/175; 357/16, 4; 427/87; 29/576 E, 576 J

[56] References Cited

U.S. PATENT DOCUMENTS

| | | | |
|---|---|---|---|
| 3,626,257 | 12/1971 | Esaki | 317/234 R |
| 3,963,538 | 6/1976 | Broadie et al. | 156/610 |
| 3,963,539 | 6/1976 | Kemlage et al. | 156/610 |
| 4,088,515 | 5/1978 | Blakeslee et al. | 148/175 |
| 4,120,706 | 10/1978 | Mason | 156/610 |
| 4,261,771 | 4/1981 | Dingle et al. | 156/610 |
| 4,274,890 | 6/1981 | Varon | 29/576 E |
| 4,277,762 | 7/1981 | Scitres et al. | 357/16 |

OTHER PUBLICATIONS

Serrano et al., Appl. Phys. Lett., 39(10), 11/15/81.
Zilionis et al., Sov. Phys., vol. 20, No. 5, (1980).
Applied Physics Letters, vol. 31, No. 11, 12/1/1977, Chang et al.

*Primary Examiner*—Hiram H. Bernstein
*Attorney, Agent, or Firm*—Anthony T. Lane; Jeremiah G. Murray; Robert A. Maikis

[57] ABSTRACT

Misfit dislocation density at an InAs-GaAs interface is reduced in both InAs-GaSb and $In_{1-x}Ga_xAs$-$GaSb_{1-y}As_y$ superlattices grown on GaAs substrates by means of a MBE (molecular beam epitaxy) growth technique consisting of a step graded sequence of composition layers between substrate and superlattice whose composition changes in discrete concentration steps from the composition of the substrate to the composition of the superlattice.

14 Claims, 3 Drawing Figures

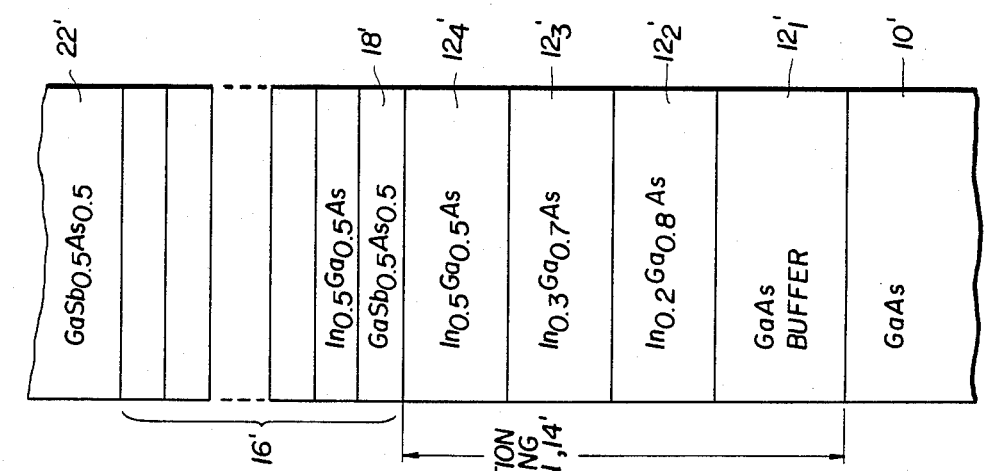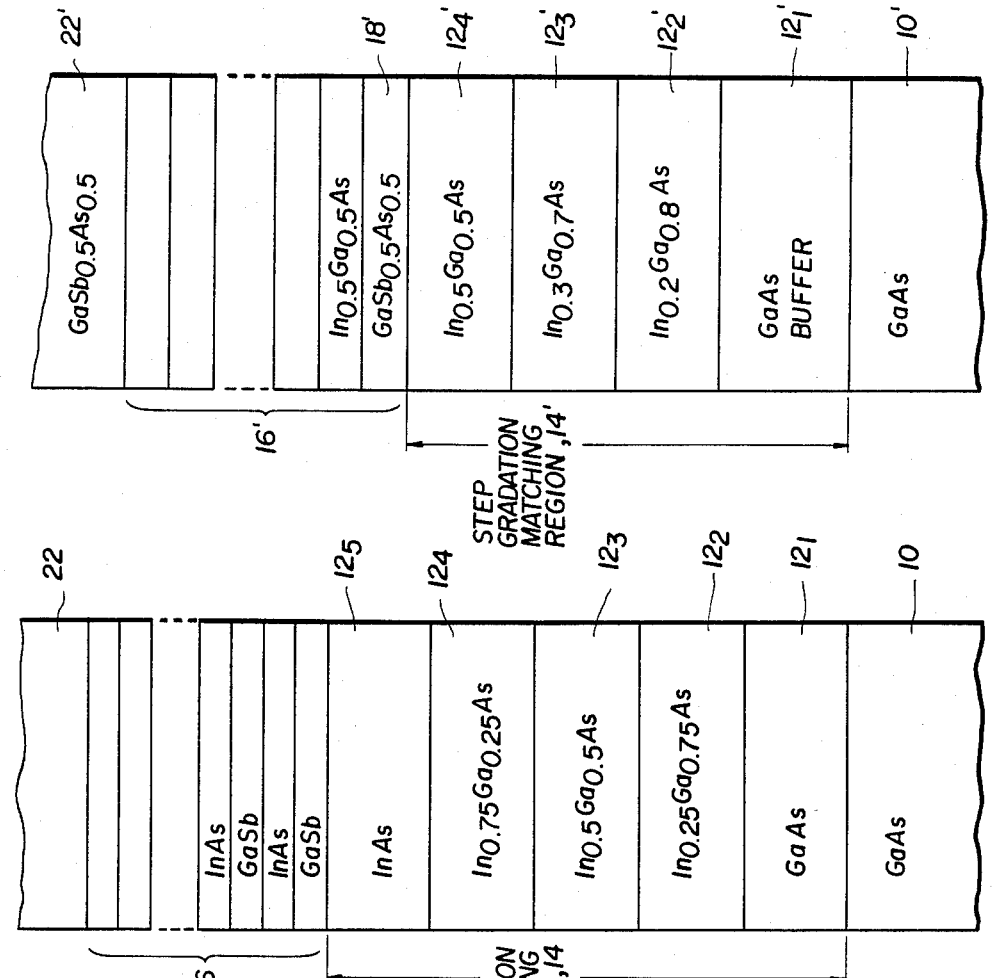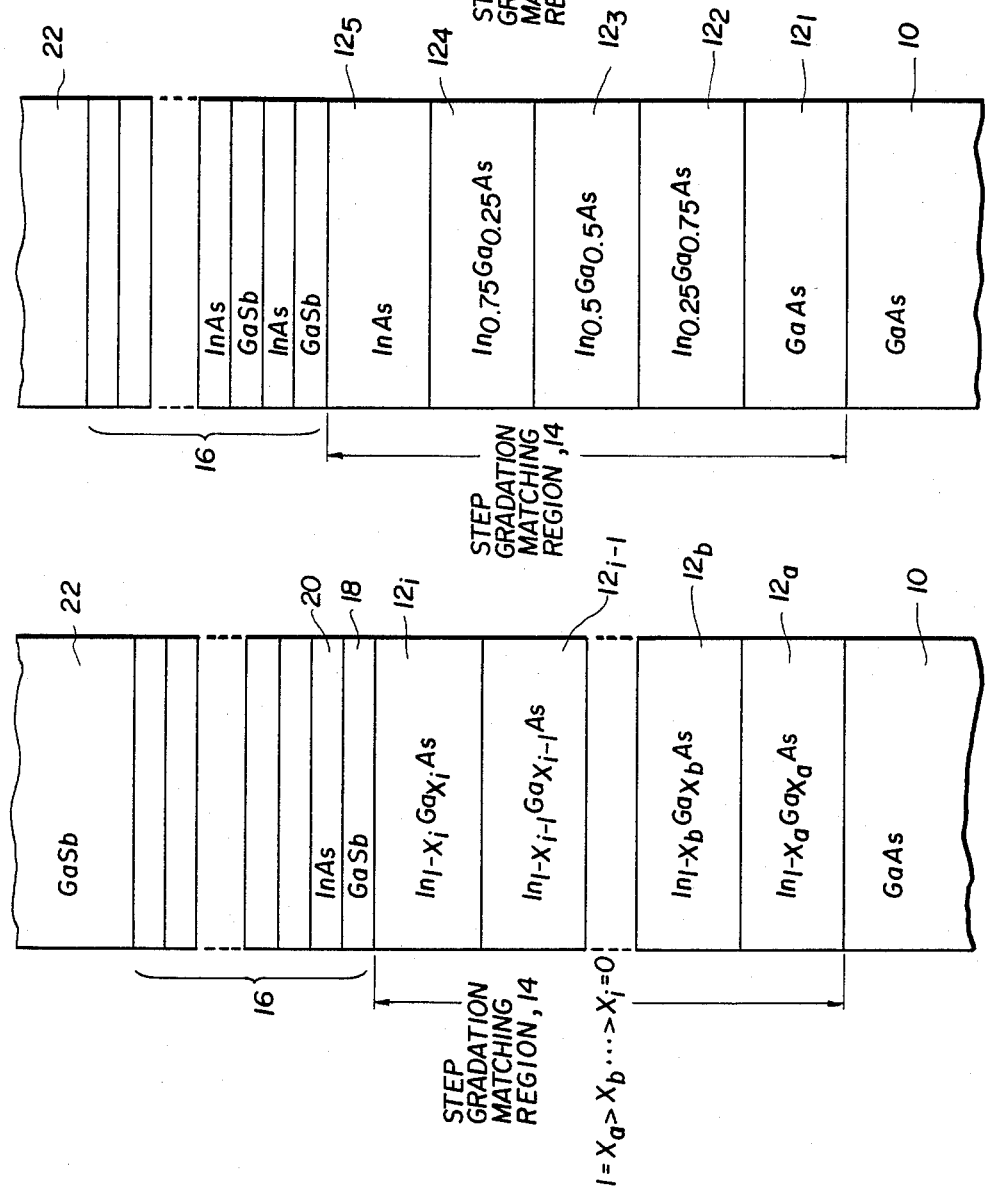

MBE GROWTH TECHNIQUE FOR MATCHING SUPERLATTICES GROWN ON GAAS SUBSTRATES

The invention described herein may be manufactured and used by or for the Government for governmental purposes without the payment of any royalties thereon or therefor.

BACKGROUND OF THE INVENTION

This invention relates generally to semiconductor devices and more particularly to semiconductor devices having a superlattice region formed on a base substrate.

In thin film heteroepitaxy, the problem of lattice mismatch between the overgrowth and the substrate often poses a major limitation as to the choice of an optimum heteroepitaxial system. This mismatch causes a high density of misfit dislocations to be formed. Where the base substrate is of such a composition that it is impossible to match the lattice parameter of the superlattice with that of the substrate an additional substrate layer with a lattice parameter equal to the average parameter of the superlattice has heretofore been grown by gradually changing the composition from that of the base substrate composition to a composition which matches the average lattice parameters of the multilayer. Such a concept has been shown and described in U.S. Pat. No. 4,088,515 entitled, "Method of Making Semiconductor Superlattices Free of Misfit Dislocations" which issued to A. E. Blakeslee, et al. on May 9, 1978.

Because a relatively large lattice mismatch exists between InAs and GaAs and between GaSb and GaAs, the growth of either InAs-GaSb or $In_{1-x}Ga_xAs$-$GaSb_{1-y}As_y$ superlattices onto a GaAs substrate presents a problem for which the continuous grading layer solution taught in the Blakeslee patent does not result in overcoming the mismatch problem. Undesirable carrier concentrations for undoped superlattices in the order of $1 \times 10^{17} - 1 \times 10^{18}$ cm.$^{-3}$ for n-type InAs-GaSb superlattices with mobilities of less than 300 cm.$^2$/V-sec. and concentrations of $1 \times 10^{17} - 1 \times 10^{18}$ cm.$^{-3}$ for p-type $In_{0.5}Ga_{0.5}As$-$GaSb_{0.5}As_{0.5}$ superlattices have been observed.

It is an object of the present invention, therefore, to provide an improvement in overcoming the lattice mismatch between semiconductor compositions.

It is a further object of the present invention to eliminate or at least to minimize misfit dislocations between a substrate and the superlattice structure grown thereon.

It is yet another object of the present invention to overcome the problem of lattice mismatch between the composition of a superlattice grown on a GaAs substrate.

And still a further object of the present invention is to overcome the mismatch problem of films of InAs and GaSb grown on GaAs substrates.

SUMMARY OF THE INVENTION

The above objects are accomplished by the method of and the resulting product from, growing a step graded sequence of semiconductor composition layers between two regions of lattice mismatch by molecular beam epitaxy wherein the concentration of the respective composition varies in discrete steps from the composition of the first region to a composition which matches the lattice parameters of the second region.

These and other objects of the invention will become apparent from the following detailed description of the preferred embodiments illustrated in the accompanying drawings.

BRIEF DESCRIPTION OF THE DRAWING

FIG. 1 is a schematic diagram representative of a multilayer structure of a semiconductor superlattice device broadly embodying the subject invention;

FIG. 2 is a schematic diagram illustrative of a specific version of the semiconductor device shown in FIG. 1; and FIG. 3 is a schematic representation of another type of semiconductor device embodying the subject invention.

DESCRIPTION OF THE PREFERRED EMBODIMENTS

The present invention employs the technique of molecular beam epitaxy (MBE) in matching a semiconductor superlattice region to a substrate in order to reduce the misfit dislocation density from the interface region therebetween. In a publication entitled, "Molecular-Beam Epitaxy (MBE) of $In_{1-x}Ga_xAs$ and $GaSb_{1-y}As_y$," by C. Chang, et al., which appeared in *Applied Physics Letters*, Volume 31, No. 11 Dec. 1, 1977 at pages 759–761, there is disclosed the experimental conditions in the growth characteristics for films of $In_{1-x}Ga_xAs$ and $GaSb_{1-y}As_y$ being grown on gallium arsenide (GaAs), indium arsenide (InAs) and gallium antimonide (GaSb) substrates by the technique of molecular beam epitaxy. It is this type of semiconductor composition and this fabrication technique that find application in the present invention. More particularly, the present invention finds application where films of InAs and GaSb and their alloys are grown on GaAs substrates where the lattice mismatch is relatively large and on the order of 7–8%. Investigations by both X-ray diffraction and transmission electron microscopy have demonstrated that most of the misfit stress, which results in a high density of defects having a pronounced effect on the electron mobilities of the films is relaxed.

As will become apparent from the following detailed description, the present invention discloses a step grading technique which involves growing by MBE a plurality of discrete graded alloy layers whose composition and concentration vary in a step-wise fashion from the composition of the substrate to the composition of superlattice. Referring now to the figures which are intended to illustrate this step grading technique and the resulting structure realized therefrom, reference is first made to FIG. 1 wherein reference numeral 10 designates a substrate of GaAs on which is grown, by the method of molecular beam epitaxy (MBE), a plurality of $In_{1-x}Ga_xAs$ layers $12_a$, $12_b$ ... $12_{i-1}$ and $12_i$ wherein x signifies the respective concentration of In and Ga and varies between 1 and 0. The thickness of the layers $12_a$ ... $12_i$ range between 1000 Å and 4000 Å and when desirable, can have a constant thickness on the order of substantially 2000 Å. The layers $12_a$ ... $12_i$ define a step gradation matching region 14 intermittent the GaAs substrate 10 and a superlattice region 16 comprised of plural alternating layers 18 and 20 of GaSb and InAs, respectively, which have a nominal thickness less than 100 Å. The step gradation of the layers $12_a$ ... $12_i$ involves varying the concentration of In and Ga in discrete steps between the GaAs substrate 10 and the first GaSb superlattice layer 18. Furthermore, the composition is varied from the composition of the substrate to the composition which matches the superlattice region 16.

Accordingly, where $x_a$ is equal to 1 and $x_i$ is equal to 0 and the successive values of x therebetween decrease in predetermined increments, a stepped transition results which causes a reduction in dislocation density accompanied by a simultaneous enhancement in electron mobility. In such an arrangement, the first intermediate layer $12_a$ will be comprised of a buffer layer of GaAs while the layer $12_i$ contiguous with the GaSb superlattice layer 18 is comprised of InAs.

A more specific embodiment of the step gradation matching region 14 is shown in FIG. 2. Shown therein is five graded layers $12_1, 12_2 \ldots 12_5$ wherein the first and last layers $12_1$ and $12_5$ are comprised of GaAs and InAs, respectively. The three middle layers $12_2$, $12_3$ and $12_4$ are comprised of $In_{0.25}Ga_{0.75}As$, $In_{0.5}Ga_{0.5}As$, and $In_{0.75}Ga_{0.25}As$, thus indicating that the concentration of In increases in 0.25 increments between the substrate 10 and the superlattice 16 while the concentration of Ga decreases in equal 0.25 increments. Also, in such an arrangement as shown in FIG. 2, the width of the layers $12_1 \ldots 12_5$ are substantially equal and are in the order of 2000 Å each. While not shown, the step gradation matching regions can, when desirable, be unequal both in width and concentration levels and typically can be configured as follows: 3000 Å of $In_{0.2}Ga_{0.8}As$, 2000 Å of $In_{0.3}Ga_{0.7}As$, 3600 Å of $In_{0.5}Ga_{0.5}As$, 2400 Å of $In_{0.75}Ga_{0.25}As$ and 2000 Å of InAs.

With respect to the superlattice structure 16 in combination with a step gradation region 14 in accordance with the subject invention 400 periods of 40 Å InAs and 60 Å GaSb result in the carrier concentration "n" which is in the order of $5 \times 10^{16}$ cm.$^{-3}$ and an electron mobility $\mu$ in the order of 2700 cm.$^2$/V-sec. while 450 periods of 50 Å InAs and 30 Å GaSb provides a carrier concentration in the order of $6 \times 10^{16}$ cm.$^{-3}$ and an electron mobility $\mu$ in the order of 2380 cm.$^2$/V-sec.

The greatly reduced misfit dislocation density observed in the structure such as shown in FIGS. 1 and 2, using the step grading technique disclosed, is believed due to the reduced density of dislocations generated at each interface and the bending of the propagating inclined dislocations at these interfaces. When the inclined dislocations propagate and reach a following interface, they are believed to bend at this interface to relieve its corresponding misfit stress. Such a bending mechanism has been proposed to reduce propagation of the inclined dislocations to subsequent layers by the disclosed step grading technique.

For a configuration including an $In_{1-x}Ga_xAs$-$GaSb_{1-y}As_y$ superlattice, the same discrete concentration increments between the superlattice structure and the substrate exist. Where, for example, an $In_{0.5}Ga_{0.5}As$-$GaSb_{0.5}As_{0.5}$ superlattice is desired to be grown by the MBE techniques described above on a GaAs substrate, reference to FIG. 3 discloses a gallium arsenide substrate 10 on which a step gradation matching region 14' is fabricated including a GaAs buffer layer $12_1'$ and three succeeding layers $12_2'$, $12_3'$ and $12_4'$ having the respective concentrations of $In_{0.2}Ga_{0.8}As$, $In_{0.3}Ga_{0.7}As$, and $In_{0.5}Ga_{0.5}As$. The layer $12_4'$ matches the lattice concentration of the first 18' which consists of Ga $Sb_{0.5}As_{0.5}$ and to which $12_4'$ thereof which consists of is contiguous. Where for example superlattice 16' shown in FIG. 3 is comprised of 230 periods of 60 Å $In_{0.5}Ga_{0.5}As$ and 60 Å $GaSb_{0.5}As_{0.5}$ a carrier concentration in the order of $7 \times 10^{15}$ cm.$^{-3}$ and an electron mobility $\mu$ in the order of 2830 cm.$^2$/V-sec. can be obtained.

A similar step grading sequence can also be utilized, when desired, to improve the electron mobilities between InAs and $In_{1-x}Ga_xAs$ films themselves as well as in any other structures where the lattice mismatch presents a problem to the operational characteristic of the device.

Thus what has been shown and described is an improved method and means for reducing the dislocation density while improving the electron mobility for films and superlattices grown on GaAs substrates. While the invention has been shown and described with reference to what is at present considered to be the preferred embodiments thereof, it should be understood that the foregoing has been made by way of illustration and not of limitation and accordingly all alterations, modifications coming within the spirit and scope of the invention as defined in the subjoined claims are herein meant to be included.

We claim:

1. The method of growing multilayer semiconductor devices wherein lattice mismatch between first and second semiconductor layers having respective different compositions is overcome by substantially reducing the misfit dislocation density while enhancing electron mobility therebetween, comprising the steps of:

sequentially growing on said first layer a plurality of successive intermediate semiconductor layers of predetermined thickness whose composition varies in discrete graded steps of semiconductor composition from a composition which substantially matches the lattice parameters of the first layer to a composition which substantially matches the lattice parameters of the second layer; and thereafter growing said second layer on the outermost inner intermediate layer.

2. The method of claim 1 wherein said steps of growing comprises the process of molecular beam epitaxy and said first semiconductor layer comprises a substrate and said second semiconductor layer comprises a relatively thin film.

3. The method as defined in claim 2 wherein said thin film comprises the innermost layer of a superlattice structure.

4. The method as defined in claim 3 wherein said substrate is comprised of GaAs.

5. The method as defined by claim 4 wherein said superlattice structure comprises a InAs-GaSb superlattice.

6. The method as defined by claim 5 wherein said plurality of intermediate layers is comprised of mutually different concentrations of $In_{1-x}Ga_xAs$ where x varies in discrete steps between 1 and 0 as the layers progress from said GaAs substrate to the innermost layer of said superlattice.

7. The method as defined by claim 6 wherein said innermost layer of said superlattice is comprised of a layer of GaSb.

8. The method as defined by claim 4 wherein said superlattice comprises an $In_{1-x}Ga_xAs$-$GaSb_{1-y}As_y$ superlattice.

9. The method as defined by claim 8 wherein said plurality of intermediate layers is comprised of mutually different concentrations of $In_{1-x}Ga_xAs$ wherein x varies in discrete steps as the layers progress from said GaAs substrate to said innermost layer of said superlattice.

10. The method as defined by claim 9 wherein said innermost layer of said superlattice comprises a layer of GaSb$_{1-y}$As$_y$.

11. The method as defined by claim 10 wherein the values x and y of said superlattice structure are of the same value between 1 and 0 wherein the value x of said intermediate layers varies in discrete steps between 0 and the value of x and y of said superlattice structure.

12. The method as defined by claim 6 wherein said predetermined thickness of said intermediate layers is at least 1000 Å.

13. The method as defined by claim 6 wherein said predetermined thickness of said intermediate layers selectively ranges between 1000 Å and 4000 Å.

14. The method as defined by claim 13 wherein said superlattice is comprised of alternating layers of semiconductor material having respective thicknesses of less than 100 Å.

* * * * *